United States Patent [19]
Schmidt

[11] Patent Number: 5,457,881
[45] Date of Patent: Oct. 17, 1995

[54] METHOD FOR THE THROUGH PLATING OF CONDUCTOR FOILS

[75] Inventor: Walter Schmidt, Zürich, Switzerland

[73] Assignee: Dyconex Patente AG, Zug, Switzerland

[21] Appl. No.: 187,393

[22] Filed: Jan. 25, 1994

[30] Foreign Application Priority Data

Jan. 26, 1993 [CH] Switzerland ............... 217/93

[51] Int. Cl.⁶ ..................................... H01K 3/10
[52] U.S. Cl. ............................. 29/852; 29/830
[58] Field of Search ................ 29/830, 846, 852

[56] References Cited

U.S. PATENT DOCUMENTS

| | | | |
|---|---|---|---|
| 3,835,531 | 9/1974 | Luttmer | 29/830 X |
| 3,953,924 | 5/1976 | Zachry et al. | |
| 4,769,309 | 9/1988 | King et al. | 430/311 |
| 4,991,285 | 2/1991 | Shaheen et al. | 29/830 |
| 5,072,075 | 12/1991 | Lee et al. | 29/846 X |
| 5,179,777 | 1/1993 | Suzuki | 29/830 X |
| 5,199,163 | 4/1993 | Ehrenberg et al. | 29/846 X |

FOREIGN PATENT DOCUMENTS

| | | |
|---|---|---|
| 0533198 | 3/1993 | European Pat. Off. . |
| 9102817 U | 10/1991 | Germany . |
| 1126370 | 9/1968 | United Kingdom . |

Primary Examiner—Carl J. Arbes
Attorney, Agent, or Firm—Walter C. Farley

[57] ABSTRACT

Electrical connections in multilayer printed circuit boards made from conductor foils are preworked by producing preworked electrical connections on the conductor foils to be subsequently processed and for this purpose photoresist is laminated onto said conductor foils, in such a way that in a photochemical process a freely selectable pattern of recesses in the photoresist is exposed and developed, that in a galvanic plating process metal is plated in said recesses and the photoresist is subsequently removed, that at least two conductor foils are pressed, in such a way that the conductor foils are separated by at least one intermediate adhesive film or foil and that each adhesive foil is laminated onto at least one conductor foil, each of said intermediate adhesive foils engaging on at least one conductor foil with preworked electrical connections in such a way that on pressing at least two conductor foils the electrical connections preworked on at least one of the conductor foils penetrates the intermediate adhesive foil and electrical connections are formed between said conductor foils.

5 Claims, 3 Drawing Sheets

5,457,881

METHOD FOR THE THROUGH PLATING OF CONDUCTOR FOILS

The invention relates to the production of multilayer printed circuit boards and concerns a method for the production of electrical connections between conductor layers of such boards.

In the conventional methods of printed circuit board technology board holes are mainly used for the electrical connection of different conductor layers and are produced by mechanical drilling. For this purpose use is made of multilayer printed circuit boards comprising several layers of metallic/nonmetallic coatings. The holes are then e.g. filled with electrically conductive materials, so that the electrical connections are formed. By the means of structuring (layout) of the conductor foils, e.g. by the planned removal of individual surface areas of the outer metal coatings of said conductor foils, the finished circuit is obtained. A disadvantage of this method is the size of the hole diameter of e.g. 0.2 mm forced by the mechanical drilling process. For many uses such drilled holes take up too much space, whilst not permitting an optimum, ultra-dense conductor coverage. The mechanical drilling of holes for electrical connections constitutes a technical limit in circuit board technology, because as a result only hole diameters larger than 0.2 mm can be sensibly produced from the technical and economic standpoints. A non-mechanical method for the production of smaller holes consists of the galvanic through plating of completely predrilled printed circuit boards, but this is a process suffering from a relatively large amount of wastage and which is also expensive. If use is made of wet chemistry, large plants must be provided for production and disposal, which involves high capital expenditure. Waste during production increases the cost of the product and possible contact failures in the vicinity of the plating sleeve used cause considerable subsequent costs. This is reason enough to seek new methods.

A more recent method solving this problem is e.g. described in Swiss Patent Application 1873/92-8 of Jun. 15, 1992. The latter makes use of a non-mechanical and non (wet) galvanic method for the simultaneous production of a plurality, of operationally reliable electrical connections of multilayer circuit foils in a relatively small number of working steps. This method also has the advantage that it is possible to use proven processing steps, which significantly improves the reliability of production. It requires a photochemical structuring of the surface and involves the use of a plasma etching plant. Despite the significant advantages offered by this technology, it is ultimately the through-etching of the conductor foil which is the speed-determining step during production. Therefore this method suffers from the disadvantage of being more time consuming than necessary and therefore expensive.

The problem of the present invention is to provide a method for producing electrical connections between different conductor layers of printed circuit boards made from metal foils or conductor foils, which is simpler and less expensive. This problem is solved by a special preparation of the conductor foils in that on said foils and in a preparatory stage preworked connections are applied, which during the lamination of the conductor foils with nonmetallic foils such as e.g. adhesive foils on a facing conductor foil or opposite metal foil permits a rapid and reliable production of multilayer printed circuit boards made from conductor foils with electrical connections also from roll-to-roll. The preworked connections on one conductor foil press through an adjacent adhesive coating of a nonmetallic foil and therefore provide a connection to the next, adjacent conductor foil or opposite metal foil. This on the one hand obviates expensive galvanic plating and on the other the more time consuming through etching of conductor foils.

BRIEF DESCRIPTION OF THE DRAWINGS

The invention is described in greater detail hereinafter relative to an embodiment and two further variants and with reference to the attached drawings, wherein show:

FIG. 1 diagrammatically shows (FIGS. 1a–1h) the sequence of the method according to the invention as regards the basic principle. The letters a–c show how it is possible with the aid of a per se known photochemical process and in a few relatively uncomplicated operations to obtain a fine, almost random and freely selectable pattern of randomly shaped recesses 3,3' for shaping preworked electrical connections. A photoresist coating 2 applied to one side 1' of a bare conductor foil 1 is exposed in accordance with the desired pattern and is then developed. After removing the reacted photoresist recesses 3,3', e.g. circular windows are formed having a very small diameter below 100 μm and which extend up to the metal of the conductor foil 1. The metal used is mainly copper, e.g. copper foils or films, such as are used for coating printed circuit boards. However, the recesses 3,3' need not be circular and can instead also be rectangular blind holes or freely structured grooves, which are shaped in a linear, ribbed or wavy manner. Advantageously these depressions produce the pattern of the electrical connections of the circuit board layout.

FIG. 1d shows how, in a subsequent galvanic plating process metal, e.g. copper, is plated zonely into the recesses 3,3'. Preferably said preworked electrical connections 4,4' completely fill the recesses 3,3', in the shown manner and in the represented variant they have flat boundaries 6,6', so that an upper surface of the heterogeneous photoresist/plating interfaces 12. This process can be controlled by an appropriate choice of the plating parameters. It is naturally also possible to successively plate on several coatings made from different metals.

Figure 1A:
FIG. 1a–1h show individual stages of the method according to the invention in a first, basic embodiment.
Figure 1B:
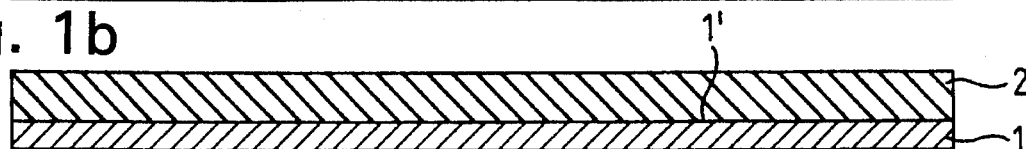
Figure 1C:
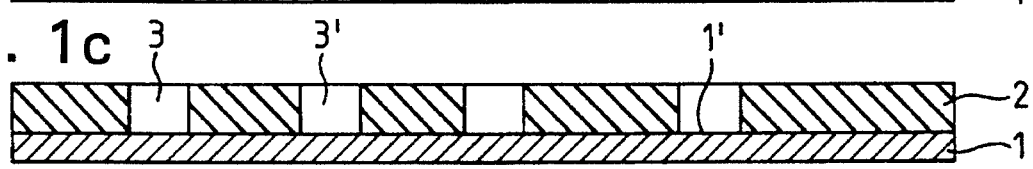
Figure 1D:
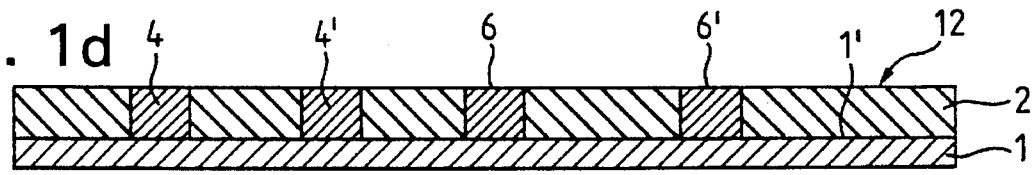
Figure 1E:
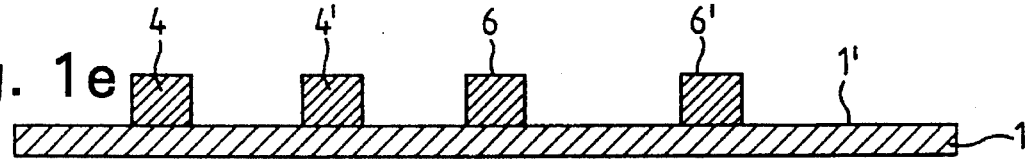

In the stage according to FIG. 1e the remaining photoresist 2 is removed, so that a bare conductor foil 1 is obtained, which now has on at least one side 1' the preworked electrical connections 4,4' in the form of protuberances. These plated on protuberances are the subsequent electrical connections in a multilayer conductor foil. The thus preworked conductor foil 1 therefore forms the starling medium for the inventive process for producing multilayer conductor foils.

Figure 1F:
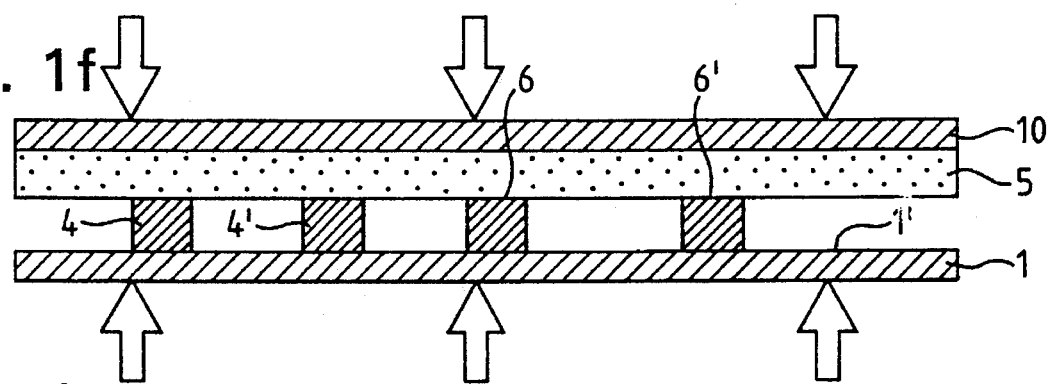
Figure 1G:
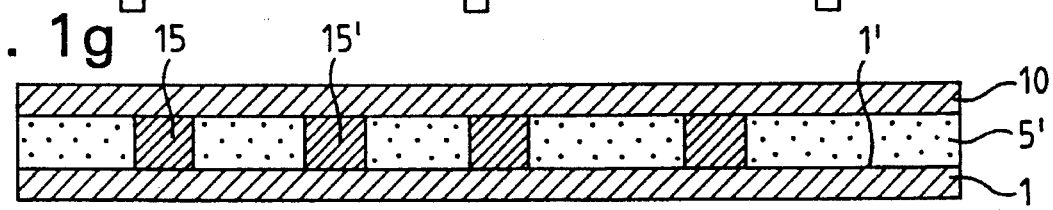

FIGS. 1f and 1g show, how it is possible using a coating of connecting medium, e.g. an adhesive foil 5, to press a second conductor foil 10 onto side 1' of the conductor foil 1 preworked in the above-described manner. The connecting medium or adhesive foil 5 is positioned intermediately between two said conductor foils 1 and 10 and can comprise commercial adhesives, such as epoxy, acrylic or polyimide resins, which are not completely cured. In a heating press the two conductor foils 1 and 10 are pressed together under pressure and optionally under an elevated temperature and this process is illustrated by the dark arrows. According to the invention the preworked electrical connections 4,4' penetrate the intermediate adhesive foil 5 and ensure the desired electrical connections in the form of electrical connections 15,15' between the conductor foils 1 and 10. These electrical connections 15,15' are stabilized on curing the coating of connecting medium or adhesive foil 5 in the cured adhesive foil 5' and consequently form electrical connections 15,15' of in this case a two-layer, electronic foil circuit. This method naturally also permits the production of foil circuits with more than two layers and from different metals. For this purpose the stages according to FIGS. 1a–1e and 1f–1g of the method must be repeated correspondingly often.

It is also possible to provide one or both sides of two and not just one of the conductor foils to be bonded with preworked electrical connections applied according to the stages of FIG. 1e. Then it is possible to laminate an adhesive foil onto one or both of the thus preworked conductor foils, so that the preworked electrical connections of the conductor foils penetrate the intermediate adhesive foils on pressing together the conductor foils and form electrical connections.

Figure 1H:
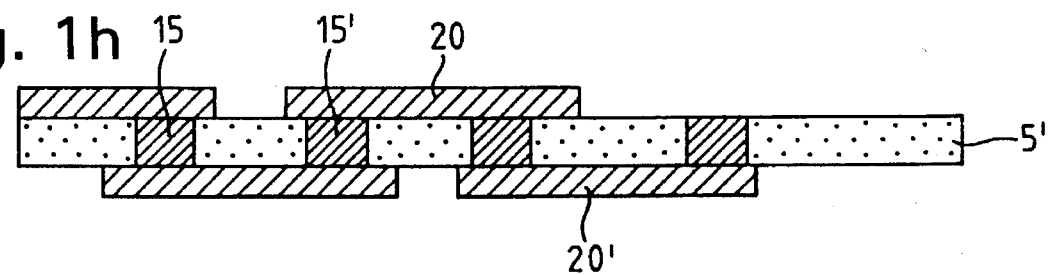

FIG. 1h shows the following structuring of the thus formed copper coatings. As a result of the planned removal of individual surface areas of the conductor foils 1 and 10, the circuit is structured in accordance with the layout of the conductor structure. This takes place by means of per se known photochemical processes, the circuit design being transferred by means of a photomask and the conductor patterns 20,20' are etched out.

For technical reasons during the stages according to FIGS. 1a–1g conductor foils 1,10 which are as thin as possible are used, so that e.g. under etching is kept to a minimum. Such thin conductor films are generally difficult to process, so that they are often coated with a mechanically more stable, thicker and so-called transfer or carrier foil. This coating is reversible and can be eliminated in nondestructive manner. It does not influence the production of the electrical connections and can be removed following the application of the photosensitive coating in the stage according to FIG. 1b or following the pressing together of the conductor foils 1,10 in the stage according to FIG. 1f. An auxiliary measure, such as the above-discussed coating, is not of central significance for the description of the inventive method and is consequently not shown in FIGS. 1, 2 and 3.

FIG. 2 shows the individual stages (FIGS. 2a–h) of the method according to the invention in a modified embodiment, where use is made of preworked electrical connections with specially shaped boundaries. This variant is appropriate so as to prevent the remaining of adhesive residues left behind by the intermediate adhesive coating between the electrical connections and the applied conductor foil or opposite metal foil 10, which would have a negative influence on the electrical contact between the foils 1 and 10.

Figure 2A:
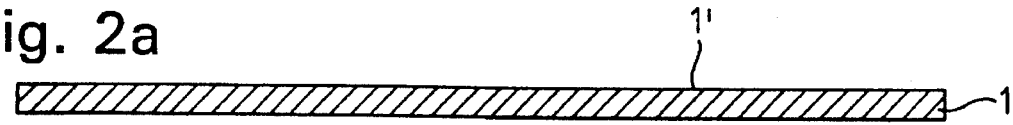
FIG. 2a–2h show individual stages of the method according to the invention in another variant, in which for the production of electrical connections recesses with specially shaped boundaries are used.
Figure 2B:
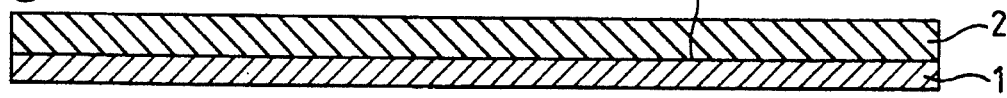
Figure 2C:
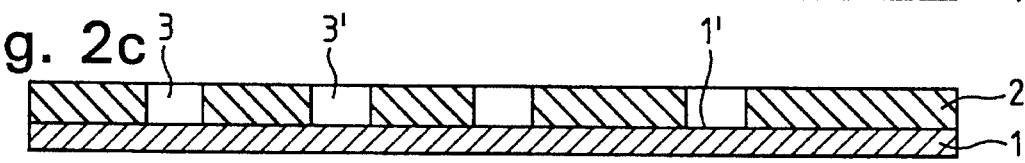

As described in connection with FIG. 1, in the stages according to FIGS. 2a–2c, a fine, randomly selectable pattern of specially shaped recesses 3,3' is formed on at least one side 1' of a bare conductor foil 1 with e.g. a laminated-on photo resist coating 2.

Figure 2D:
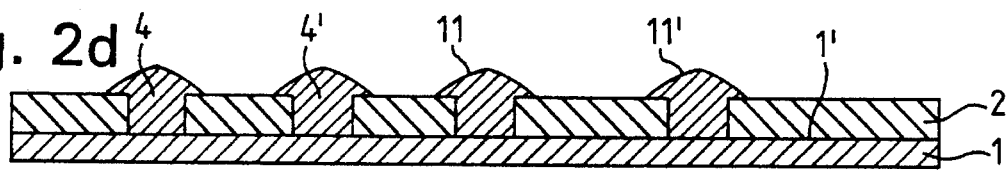
Figure 2E:
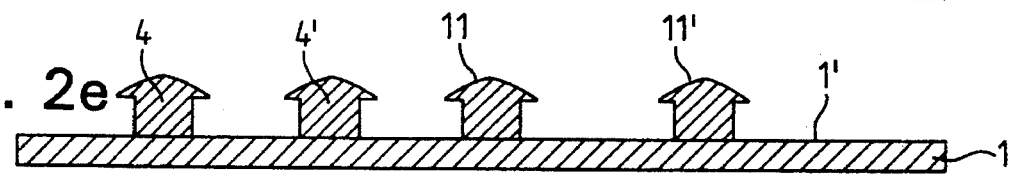
Figure 2F:
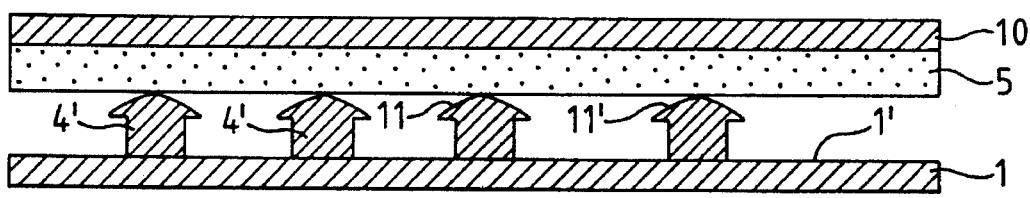
Figure 2G:
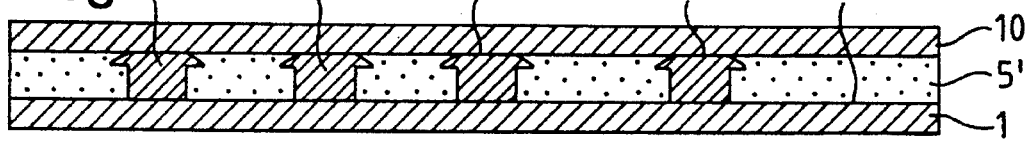
Figure 2H:
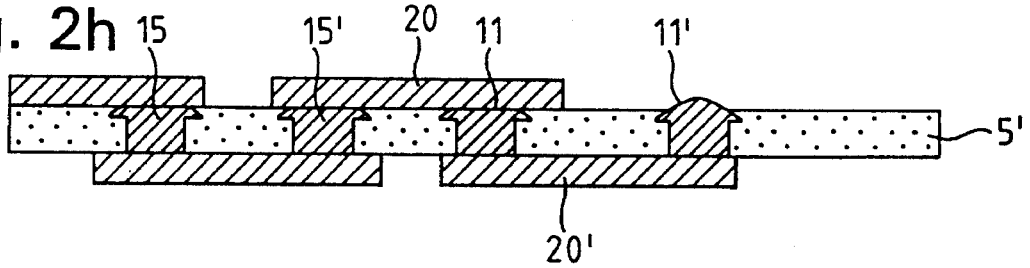

In the stage according to FIG. 2d in a galvanic plating process metal and once again preferably copper is plated into the recesses 3,3'. Unlike in the embodiment according to FIG. 1, these preworked electrical connections 4,4' not only fill the recesses 3,3' but project over the laminated-on photoresist 2 and, projecting over the interfaces 12 formed by the photoresist and the preworked electrical connections, projecting, semicircular or round and flat-bottomed boundaries 11,11'. This process can be controlled by a suitable choice of the plating parameters. It is naturally here again possible to plate on several coatings, which can be made from different metals. The remaining photoresist can then be completely removed, so that a bare conductor foil 1 is obtained, which has the preworked electrical connections 4,4' with the semicircular or round and flat-bottomed boundaries 11,11' as protuberances.

In the stages according to FIGS. 2e–2h the method according to the invention is terminated in the manner described relative to FIG. 1. Using a special coating of connecting medium or adhesive foil 5, a second conductor foil 10 is laminated with not completely cured adhesive onto side 1' of a first preworked conductor foil 1. In a heating press the two conductor foils 1, 10 are pressed together under pressure and optionally under elevated temperature. As a result of the special shaping the adhesive mass is better displaced than was the case with planar surfaces and consequently the protuberances formed by the metallic, preworked electrical connections 4,4' more easily penetrate the intermediate adhesive foil 5 and form reliable electrical connections 15,15' between the conductor foils 1 and 10, which are otherwise separated by the cured adhesive foil 5'. As a result of the semicircular or round and flat-bottomed boundaries 11,11', said connections are particularly reliable and are stabilized by the cured adhesive foil 5' and therefore form the electrical connections 15,15' of an in this case two-layer, electronic foil circuit, whereas the intermediate zones remain electrically insulated. Naturally this method can be used for producing foil circuits with more than two layers and also from different metals. For this purpose the stages according to FIGS. 2a–e and 2f–g must be correspondingly frequently repeated. It is then necessary to structure the thus formed copper coatings by the planned removal of individual surface areas of the conductor foils 1,10, so that the conductor patterns 20,20' are etched out.

FIG. 3 shows the individual stages (FIGS. 3a–3d) of the method according to the invention in a further variant, in which there is a subsequent treatment of the electrical connections 15,15'. This additional measure is appropriate so that, as in the embodiment according to FIG. 2, on joining or bonding together the conductor foils 1,10 adhesive residues are not left between the preworked electrical connections 4,4' and the pressed on, facing conductor foil 10, so as to make difficult or deteriorate the plating through of the conductor foils 1,10 leading to a poor electrical connection.

Figure 3A:
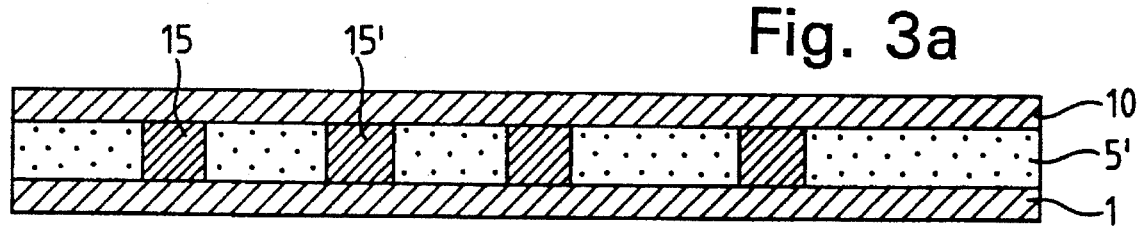
FIG. 3a–3d show individual stages of the method according to the invention in a further variant, in which there is a subsequent treatment of the electrical connections produced according to FIGS. 1 or 2.
Figure 3B:
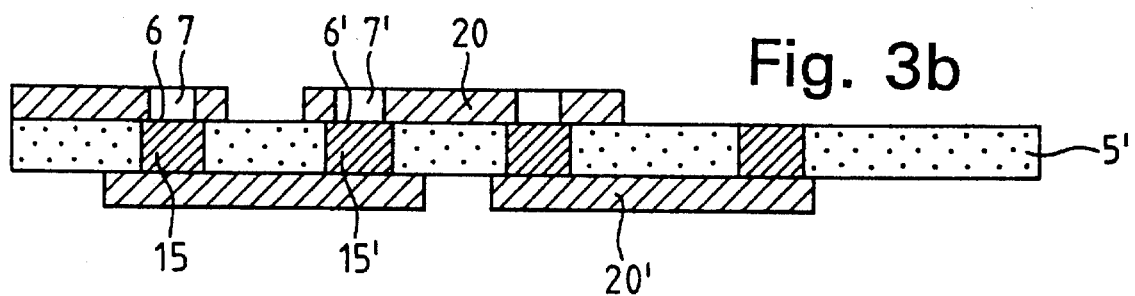

For this purpose use is made of a two-layer, electronic foil circuit as described in connection with FIGS. 1a–1g and which, with preworked electrical connections (according to FIG. 1g) is shown in FIG. 3a. This foil circuit is now treated in the stage according to FIG. 3b in such a way that in a photochemical process the circuit layout is transferred by means of a photomask onto the conductor foils 1 and 10 and the conductor patterns 20,20' are etched out (as for the stages according to letter h in FIGS. 1 and 2), whilst additionally through the electrical connections 15,15' blind holes 7,7' are formed, which give access to the flat boundaries 6,6' of the electrical connections 15,15'. By sandblasting or planned, slight plasma etching it is possible to remove any adhesive residues from the boundaries 6,6' of the electrical connections 15,15'.

Figure 3C:
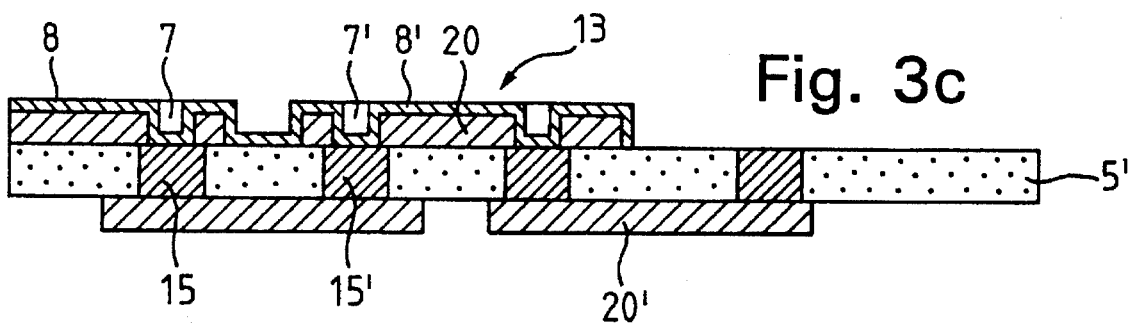

In the stage according to FIG. 3c chemically one or more metal coatings 8,8~ are applied in planned manner to the conductor foil/plating interface. The metal foil/plating interfaces 13 can be wholly or partly covered. The usable metal can e.g. be nickel, gold, tin, etc. The blind holes 7,7' can remain or can undergo diameter reduction or can be completely closed. In this way, at specific points or generally in the form of an additional treatment the electrical conductivity of the electrical connections 15,15' is improved.

Figure 3D:
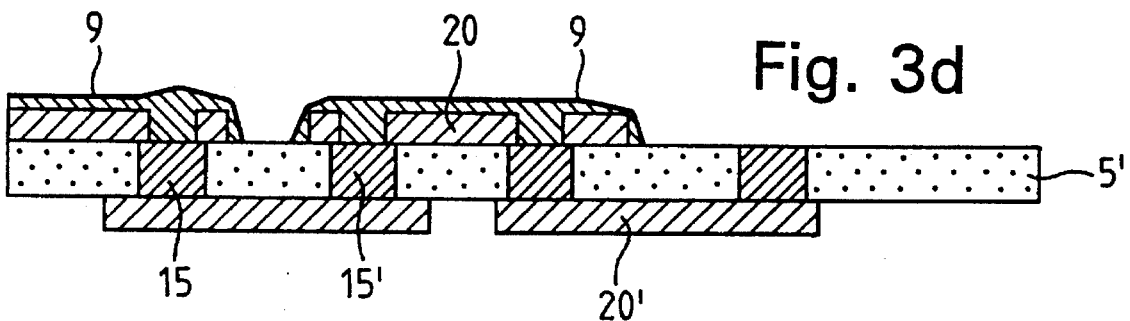

The following treatment of the conductor foils in a stage according to FIG. 3d e.g. takes place by tin plating 9 of the surface, hot air tin plating strengthening and stabilizing electrical connections 15,15' of the in this case two-layer, electronic foil circuit. Other possible working stages leading to the same result can e.g. be the pressing in of conductive solder pastes or conductive plastic into the blind holes 7,7' or merely melting.

By repeating stages according to FIGS. 3a–3d it is possible to create three, four or multiple-layer foil circuits. For this purpose, at the end of the stage according to FIG. 3d, e.g. a foil circuit can be provided with a further adhesive foil, so that in the working stage f of FIGS. 1 or 2 it can be integrated into the method again as a conductor foil 10. Numerous variants are possible and these are readily apparent to the expert with the knowledge of the present invention.

The method of the invention for producing electrical connections between thin conductor foils can be readily used in a continuous roll-to-roll processing. Both the metal foils and the non-metallic foils, as well as the photoresist and adhesive foils to be laminated on, are available in roll form and all the described working stages can be performed in flow-line manner. This is an important advance compared with conventional printed circuit board or conductor foil procedures and dead times and empty spaces caused by the transfer of individual circuit boards or conductor foils are eliminated in the present method.

I claim:

1. A method for the production of multiple-layer printed circuit boards from conductor foils comprising the steps of forming a plurality of electrical conductor protrusions on one surface of a first electrically conductive foil, shaping distal ends of the protrusions to form a generally convex surface at the end of each protrusion, thereafter positioning a second electrically conductive foil and a layer of electrically non-conductive joining material adjacent the first foil with the joining material between the first and second foils and with the protrusions on the first foil facing the second foil, pressing the two foils together so that the protrusions penetrate the joining material and so that the shaped distal ends express joining material from between the distal ends and the second foil and make good electrical contact with the second foil, thereby forming a laminate, and after formation of the laminate, removing selected portions of the first and second foils to leave patterns of electrically conductive paths on opposite sides of the joining material.

2. A method according to claim 1 wherein the step of forming a plurality of protrusions includes coating said one surface of the first foil with a photoresist, photochemically processing the photoresist to form a pattern of openings through the photoresist, plating the protrusions onto the one surface at the locations of the openings, and thereafter removing the remainder of the photoresist.

3. A method according to claim 2 wherein the step of plating is continued until plated material extends beyond the openings through the photoresist and overlays the photoresist, thereby forming the protrusions with enlarged distal end portions with convex end surfaces.

4. A method according to claim 1 and further comprising the subsequently performed steps of forming blind holes through the second foil at locations aligned with selected ones of said protrusions, and adding a layer of electrically conductive material extending into said blind holes and over selected portions of said second foil to form addition interconnections between protrusions.

5. A method according to claim 1 wherein the steps of positioning a second foil and a layer of joining material adjacent the first foil and pressing the two foils together are performed in a roll-to-roll continuous process including providing rolls of first foil, joining material and second foil, moving the foils and joining material into juxtaposition, pressing the foils together and then rolling the joined laminate onto a receiving roll.

* * * * *